United States Patent [19]

Nielsen

[11] Patent Number: 4,546,403

[45] Date of Patent: Oct. 8, 1985

[54] SOLENOID SWITCHING DRIVER WITH SOLENOID CURRENT PROPORTIONAL TO AN ANALOG VOLTAGE

[75] Inventor: Arnold D. Nielsen, Wayne, Mich.

[73] Assignee: Ford Motor Company, Dearborn, Mich.

[21] Appl. No.: 585,717

[22] Filed: Mar. 2, 1984

[51] Int. Cl.[4] ............................................. H01H 47/32
[52] U.S. Cl. ...................................... 361/154; 361/152
[58] Field of Search ................. 361/152, 154; 123/490

[56]  References Cited

U.S. PATENT DOCUMENTS 3,581,156  5/1971  Dolbachian et al. .
4,180,026  12/1979  Schulzke et al. .
4,327,394  4/1982  Harper .
4,347,544  8/1982  Ohba .
4,360,855  11/1982  Ohba .

OTHER PUBLICATIONS

Publication by SGS-ATES Semiconductor Corporation in Jun. 1982, entitled "Injector Driver Control-Tentative Data".

Primary Examiner—Reinhard J. Eisenzopf
Attorney, Agent, or Firm—Peter Abolins; Robert D. Sanborn

[57] ABSTRACT

A solenoid driver circuit has one transistor and a diode coupled to a solenoid and controlled by a logic circuit to apply a desired current to the solenoid. The transistor is turned on and off using a logic flip-flop to sense a voltage comparison with a peak current. A logic signal is generated as a function of the predetermined length of time, and an output signal is coupled to the base of the transistor to control its on/off states. The magnitude of the peak current is a function of an applied analog voltage. Thus, the magnitude of the average current in the solenoid coil is a function of the applied analog voltage. Also, a dither signal can be summed with the analog signal to minimize the effects of solenoid mechanical sticking and magnetic hysteresis.

5 Claims, 9 Drawing Figures

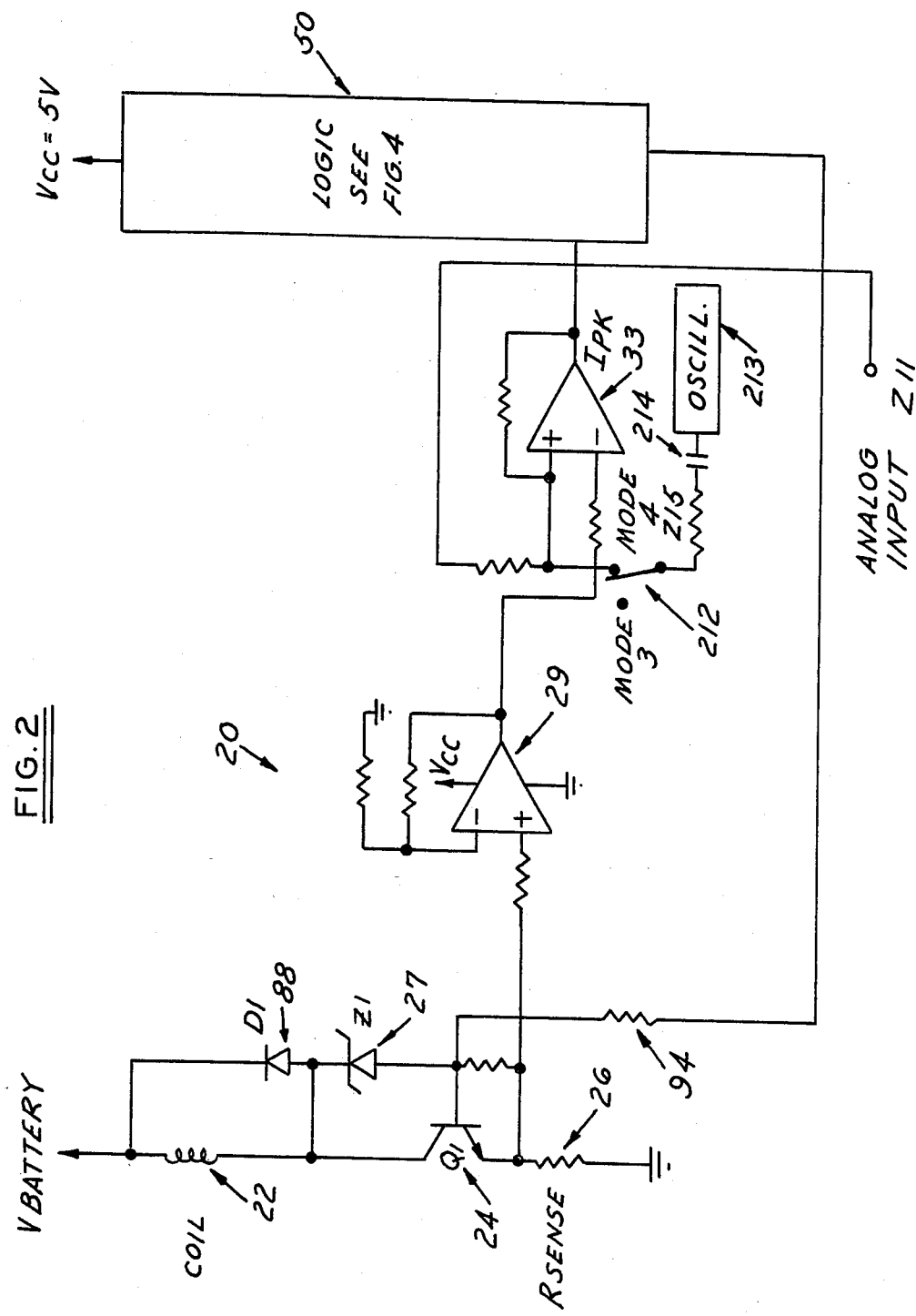

SOLENOID SWITCHING DRIVER WITH SOLENOID CURRENT PROPORTIONAL TO AN ANALOG VOLTAGE

BACKGROUND OF THE INVENTION

1. Technical Field

This invention relates to controlling the flow of current to the coil of a solenoid.

2. Background Art

Various circuitry for driving solenoids is known. For example, it is known to apply a driving current to a solenoid in accordance with a periodic function, such as a square wave, thus energizing the solenoid with an average current less than the maximum applied current. It is also known that after a solenoid is energized and initial displacement has taken place, a reduced amount of power is necessary to maintain the solenoid in an energized condition. Thus, it is possible to reduce power consumption in a solenoid by initially applying a higher peak current magnitude and then reducing the current to a lower sustaining value. Such a current reduction can take place, for example, after a certain amount of time has passed. It may be desirable to vary the magnitude of the average solenoid current so that the solenoid can provide a variable force.

Specific examples of circuitry for driving solenoids include U.S. Pat. No. 4,180,026 to Schulzke et al which teaches a pair of transistors to drive a solenoid. One of the transistors is turned on only between driving periods. Solenoid driving circuits with two transistors are also taught in patents to Ohba, U.S. Pat. Nos. 4,347,544 and 4,360,855. U.S. Pat. No. 3,581,156 to Dolbachian et al teaches an electromagnetic clutch driver having switches by which the clutch coil can be driven in a variety of modes. U.S. Pat. No. 4,327,394 to Harper teaches a relatively slow decay from a peak current to a sustaining current.

In particular, it is known to use a switching coil driver to control current to automotive fuel injector and transmission solenoids and to use switching (on-off) techniques to both minimize power dissipation and, in some cases, minimize solenoid non-linearity and hysteresis.

A solenoid driver may supply current to the coil as a current sinking or a current sourcing device. As a current sinking device, one side of the solenoid coil is connected to the battery. The solenoid is turned on by grounding (sinking) the other side of the coil through a switch such as a transistor. As a current sourcing device, one side of the solenoid coil is connected to ground. The solenoid is turned on by connecting the other side of the coil to battery voltage through a switch controlled by the solenoid driver. This configuration has the advantage of protecting for an accidental short to ground in the wiring harness between the solenoid driver and the solenoid. If this happens the solenoid will turn off rather than on, as would happen with the current sinking configuration. Turning the solenoid off is a preferred failure mode since it is advantageous to have the primary failure mode (open electrical connection) the same as the secondary failure mode (short to ground). Both configurations have the advantage of requiring only one wire from the driver to the solenoid.

A publication by SGS-ATES Semiconductor Corporation in June 1982 entitled "Injector Driver Control—Tentative Data Sheet" discloses a current sinking device with a series transistor controlling flow through a solenoid coil and a sensing resistor. A second transistor selectively provides a current path parallel to the solenoid coil. The two transistors are controlled to reduce solenoid current from an initial peak current to reduced magnitude sustaining currents. However, independent adjustment of the various current levels is not taught.

Even though reducing solenoid driving current from a peak current to a sustaining current is known, it is still desired to obtain a means to selectively control the solenoid driving current so as to provide control of solenoids providing a force or a position linearly proportional to applied solenoid coil current. In particular, an improved logic for controlling solenoid driving current would be desirable. This would improve efficiency and make the solenoid output force more responsive to desired changes. These are some of the problems this invention overcomes.

DISCLOSURE OF THE INVENTION

A solenoid driver circuit controls the application of current to a solenoid coil and reduces the total power dissipation. A transistor and diode are operatively coupled to control current flow through the solenoid. A first sense resistor is coupled in series with the solenoid to sense current in the solenoid. A first comparator means is coupled to the sense resistor to compare voltage sensed across the sense resistor to at least one control voltage. A logic means is coupled to the comparator means for switching the transistor on and off as a function of an analog input to the logic means. A solenoid coil providing force as a linear function of current is controlled by controlling the average magnitude of the solenoid current through application of peak currents with intermediate decay periods of a predetermined length. During the decay period, a diode across the solenoid coil creates a larger time constant to reduce the switching frequency.

After an initial application of power to the solenoid driver circuit, when the current through the sense resistor reaches a first level peak current ($I_{PK}$), the first comparator generates a voltage which causes the logic means to turn off the transistor coupled in series with the solenoid coil. A decay current then flows through a diode in parallel with the coil until a specified time has elapsed. Then, the first transistor is turned on and the cycle repeats. The peak current is a function of an analog voltage input. The analog voltage can determine the magnitude of the average current applied to the solenoid so as to control a linear type solenoid wherein force or position is proportional to coil current. In one embodiment, an oscillating voltage is superimposed on the analog voltage input to provide an oscillating peak current magnitude. This produces a corresponding oscillating effect on the magnitude of the average current in the solenoid and dithers the solenoid to minimize mechanical sticking and induced magnetic hysteresis.

The logic means includes one flip-flop and a timer. A comparator means is coupled to the flip-flop for generating a logic signal. A first timer means is coupled to the flip-flop means for timing the length of the predetermined current decay period. The transistor means is coupled to the flip-flop means.

BRIEF DESCRIPTION OF THE DRAWINGS

FIG. 2 is a schematic, partly block, diagram of a solenoid driver circuit coupled as a sinking driver and associated with the waveform of FIG. 1A when a switch is in Mode 3 and associated with the waveform of FIGS. 1B or 1C when the switch is in Mode 4;

DETAILED DESCRIPTION OF THE INVENTION

Figure 3:
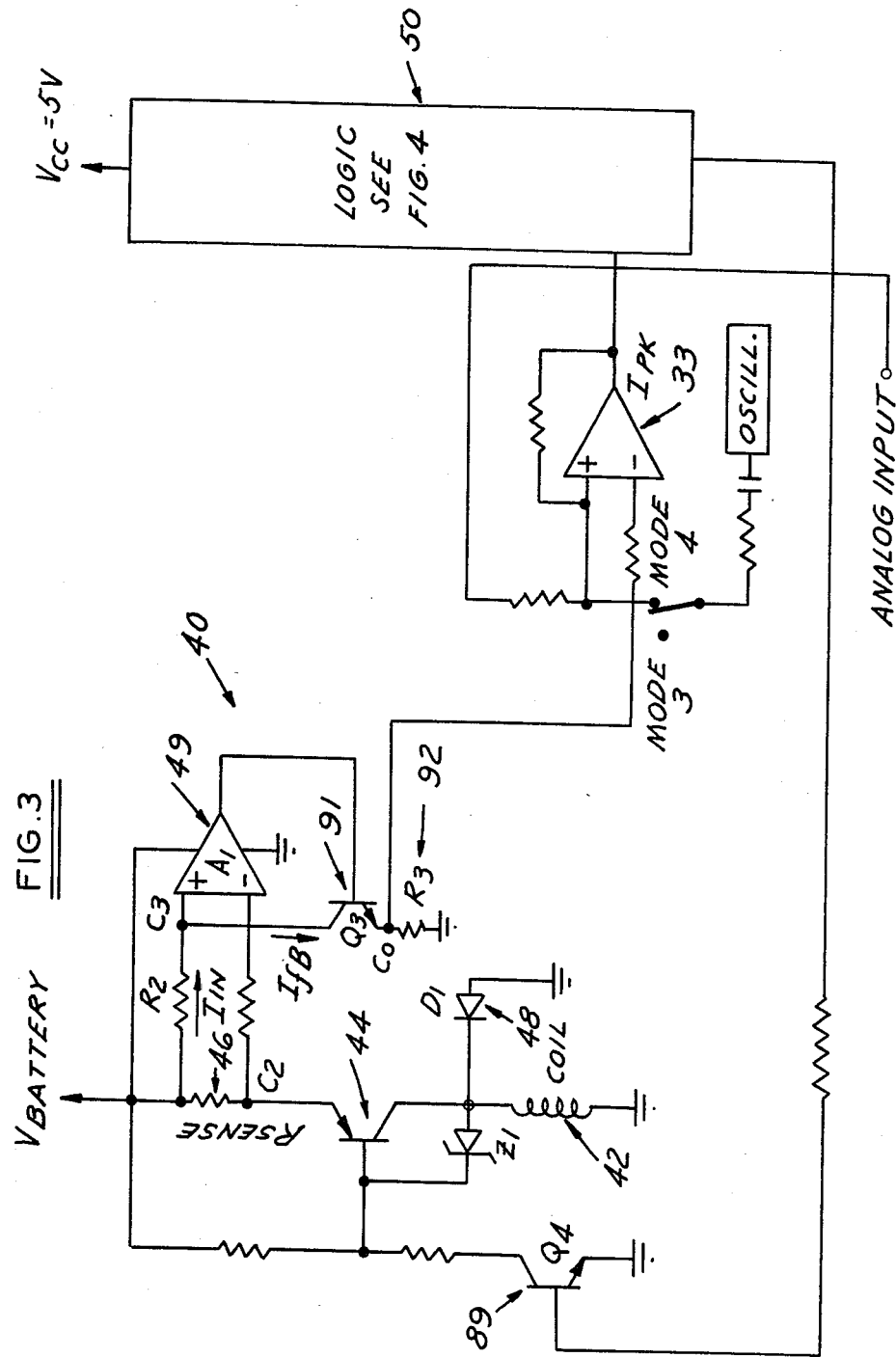
FIG. 3 is a schematic, partly block, diagram of a sourcing solenoid driver circuit connected between the solenoid coil and a battery potential, producing the waveforms associated with FIG. 1A when a switch is in Mode 3 and associated with the waveforms of FIGS. 1B or 1C when the switch is in Mode 4.

Solenoid driving circuits 20 of FIG. 2 and 40 of FIG. 3 each include voltages, Vcc, and $V_{BATTERY}$. When these voltages are applied, full battery voltage is applied to a coil (22, 42) until a specified initial peak current is reached. After this current level is reached, solenoid driver circuit 20, 40 operates to reduce coil current to a lower current. The coil current is switched between a predetermined peak current and a lower current value, the current decay being a predetermined time period, using a switching transistor. Solenoid coil current continues to switch between the peak current and the lower current as long as voltages, Vcc and $V_{BATTERY}$ are applied (see FIG. 1A).

The following explanation generally applies to both sinking driver circuitry 20 of FIG. 2 and sourcing driver circuitry 40 of FIG. 3. The difference between a sinking and a sourcing driver circuit is in the method of sensing the current caused by the different configuration of the driving circuit with respect to the coil and battery.

Referring to FIG. 2, sinking driver circuit 20 measures the current in coil 22 using sense resistor 26, one end of which is coupled to ground. The collector-emitter path of a transistor 24 is coupled in series with coil 22 and sense resistor 26 between a battery potential and a ground potential. A zener diode 27 is coupled between the base and collector of transistor 24. A non-inverting amplifier 29 has a positive input coupled to a node between sense resistor 26 and the emitter of transistor 24. The voltage applied to amplifier 29 is proportional to the current in coil 22 when transistor 24 is on.

The output of amplifier 29 is applied to the negative input of comparator 33 for establishing a peak current level. The positive input of comparator 33 is coupled to an analog input 211. The magnitude of the analog voltage affects the magnitude of the peak current and, in turn, the magnitude of the average coil current. As a result, a coil parameter, such as force, can be regulated using the magnitude of the analog voltage input. The positive input of comparator 33 is also connected to an oscillator 213 through a switch 212 and a series combination of a capacitor 214 and a resistor 215. An oscillating voltage from oscillator 213 is superimposed on the analog voltage and causes the solenoid to dither to prevent mechanical sticking and induced magnetic hysteresis. Thus, the solenoid coil current applied to a linear type solenoid can be modulated to change the instantaneous force and position provided by the solenoid. The frequency of the oscillating waveform, e.g. square wave or triangular wave, is low enough, e.g. 100 hz, so that the coil can respond to it, but not so low that undesirable variations are induced in the solenoid coil controlled parameter, e.g. hydraulic pressure. The square wave (see FIG. 1B) or triangular wave (see FIG. 1C) amplitude is typically set to achieve 10 percent of full scale coil current about a nominal average current. In other words, the additional ripple is of such a frequency and amplitude that solenoid hysteresis is minimized. This hysteresis is due to stiction of the coil mechanism which is different for increasing current versus decreasing current. The stiction is overcome by the low frequency square wave or triangular wave current which prevents the mechanism from settling by keeping it in constant motion.

Logic circuit 50 processes input information and applies an output to transistor 24 through a resistor 94 (FIG. 2). Diode 88 has a path coupled in parallel with coil 22 and provides a low resistance to reduce the speed of current decay in coil 22 after the peak current is reached.

When voltages, Vcc and $V_{BATTERY}$ are applied, transistor 24 turns on. Subsequently, when the predetermined initial peak current level through coil 22 is reached, transistor 24 turns off and a decay current flows through diode 88.

Figure 1A:
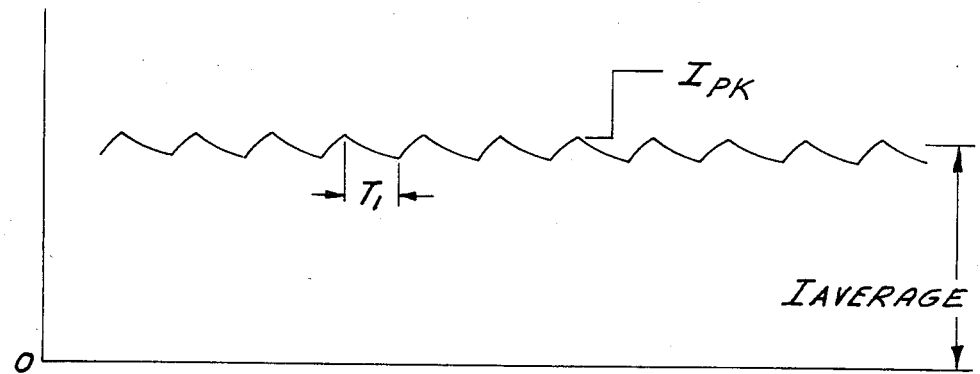
FIG. 1A is a waveform associated with both sinking and sourcing solenoid driver embodiments when a constant analog input is applied to set the magnitude of the average current through the solenoid.
Figure 1B:
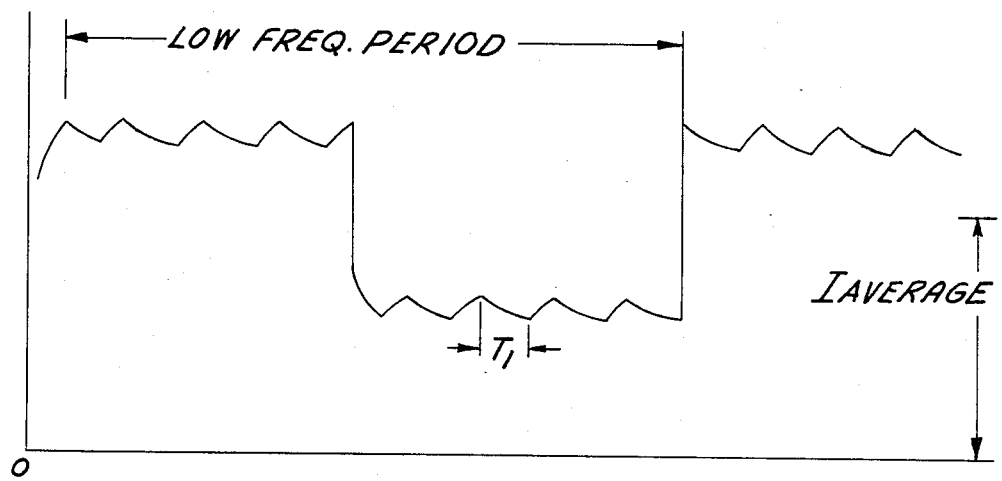
FIGS. 1B and 1C are waveforms similar to FIG. 1A with the addition of an oscillating voltage input, square wave and triangular, respectively, superimposed on the analog voltage input so as to provide an oscillating magnitude of the average solenoid current.
Figure 1C:
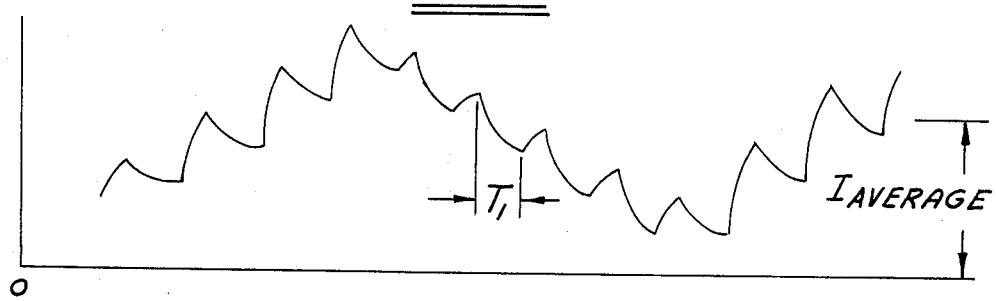

Transistor 24 is turned off for a specified time interval $T_1$ (FIG. 1A). Due to diode 88, the coil decay time constant is increased because of a low resistance path inserted in parallel with coil 22. As is known, the time constant for discharging an inductive resistive circuit is inversely proportional to the resistance. A diode 88 coupled across coil 22 allows current flow only during this decay period. A reduced current level is reached after time interval $T_1$ elapses. Then transistor 24 is again turned on until the peak current is again achieved at which point transistor 24 turns off for a time $T_1$. This sequence continues as long as voltages, Vcc and $V_{BATTERY}$ are applied indicating a desired energization of coil 22.

Thus, transistor 24 is on during increasing coil current and off during decaying coil current. Due to diode 88, decays from the peak current magnitude to a lower value of current are more gradual than if a parallel diode 88 were not used. This results in a reduced power dissipation compared to operating at higher frequency coil current where transistors, such as transistor 24, are less efficient.

Referring to sourcing driver circuit 40 of FIG. 3, the reference for the current sensing circuitry is the battery voltage, and not ground. A differential amplifier 49 senses the voltage across sense resistor 46 using a positive input on one side of a sense resistor 46 and a negative input on the other side of sense resistor 46. Operation of circuit 40 is similar to the operation of circuit 20. Transistor 44 is in series with coil 42 and controls the application of driving current to coil 42. Diode 48 conducts only a decay current, and does not conduct a driving current. Zener diode 47 provides voltage protection for transistor 44. Transistor 44 is actuated through a transistor 89 from logic circuit 50. The voltage across sense resistor 46 is applied to comparator 33 through an amplifier 49, a transistor 91 and a resistor 92. As before, voltage from the analog input is applied to comparator 33 to generate signals to be applied to logic circuit 50 which, in turn, generates outputs to be applied to transistor 44.

Figure 4:
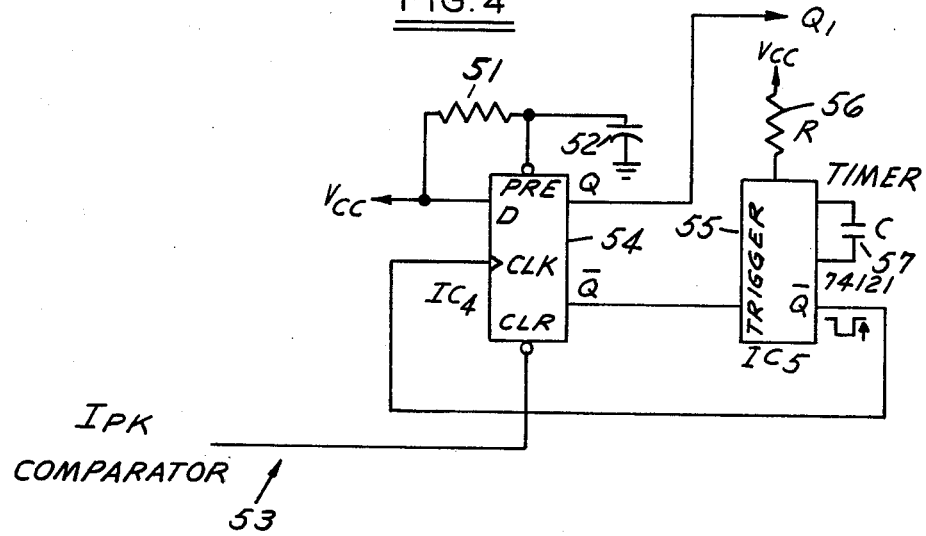
FIG. 4 is a logic schematic, partly block, diagram of a logic circuit associated with both FIGS. 2 and 3.

Referring to FIG. 4, logic circuit 50 is common to both sourcing driver circuit 40 and sinking driver circuit 20. The output from comparator 33 is applied to input 53 of logic circuit 50. Output from logic circuit 50 is applied to transistor 24 of circuit 20 and transistor 44 of circuit 40. The operation of logic circuit 50 is explained below with respect to both FIG. 4 and FIGS. 5A through 5C.

LOGIC CIRCUIT OPERATION

Figure 5A:
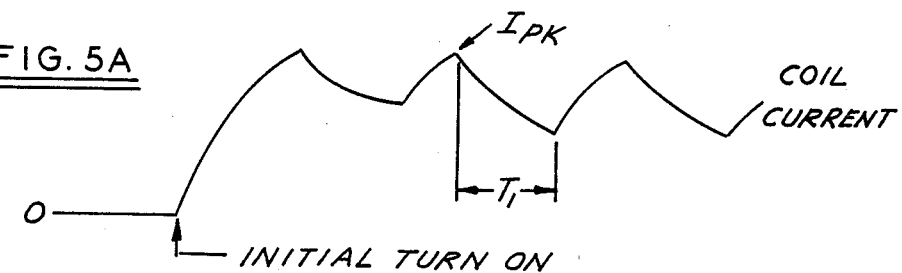
FIGS. 5A, 5B and 5C are waveforms with respect to time associated with FIGS. 2 and 3 and include, coil current, voltage across the sense resistor and peak current comparator output, respectively.
Figure 5B:
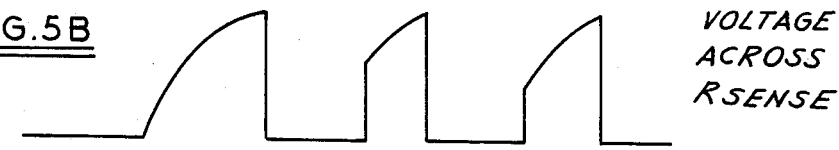
Figure 5C:
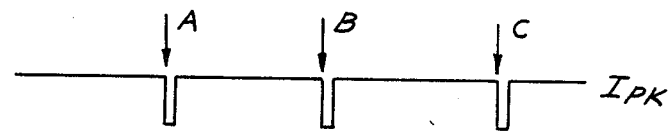

The input provided by peak current comparator 33 is shown in FIG. 5C. In FIG. 4, integrated circuit 54 is a D-type flip-flop such as a commercially available No. 7474. Integrated circuit inputs include a clock input, a clear input, a D-input and a preset input. Outputs include a Q and an inverse of Q. When a clear input goes to a logic zero, output Q goes to a logic zero and the inverse of output Q goes to a logic one. When a logic zero is applied to the preset input, the output Q goes to a logic one and the Q inverse output goes to a logic zero. When there is a rising positive edge of a pulse applied to the clock input, the logic input level appearing at the D input is applied to the Q output and its inverse is applied to the inverse Q output.

Upon initial energization of Vcc and $V_{BATTERY}$, capacitor 52 presets circuit 54 so that the Q output is a logic one and turns on transistor $Q_1$. Integrated circuit 55 is typically a 74121 and has a timing function. The timing function of integrated circuit 55 is not triggered at this time since triggering requires a logic zero to one transition applied to the trigger input. During the time $Q_1$ is turned on, the inverse of Q output of IC5 is a logic one.

When the current through the coil reaches peak current, $I_{PK}$, the $I_{PK}$ comparator changes to a logic zero as shown by point A in FIG. 5C. This clears IC4 and changes its Q output to logic 0. This turns off transistor $Q_1$. The clearing of IC4 causes a zero to one transition on its Q output which triggers IC5. This triggering of IC5 creates a one to zero transition on the inverse of Q output of IC5. This has no effect on IC4 since IC4 requires a zero to one transition on its clock input to be affected.

After a predetermined time, $T_1$ in FIG. 5A, the inverse of Q output of IC5 makes a zero to one transition. This causes the Q output of IC4 to the logic one state and turns transistor $Q_1$ on again. This recited cycle continues as long as Vcc and $V_{BATTERY}$ are applied.

Following are test results using a switching driver in accordance with an embodiment of this invention in comparison with a linear driver on linear force solenoids. The power dissipation of such a switching driver for a linear solenoid is substantially less than the power dissipation of a linear driver for a linear solenoid.

| | TOTAL POWER DISSIPATION OF DRIVER TRANSISTOR - WATTS* | |
|---|---|---|
| LOAD | LINEAR DRIVER | SWITCHING DRIVER |
| Linear Force solenoid R = 2.5 ohms L = 5 mh | 12** | 0.5** |

*V battery = 14 v
**At 1 amp

Various modifications and variations will no doubt occur to those skilled in the various arts to which this invention pertains. For example, the circuit components coupled to the logic circuit may be varied from that described herein. These and all other variations which basically rely on the teachings through which this disclosure has advanced the art are properly considered within the scope of this invention as defined by the appended claims.

I claim:

1. A solenoid driver circuit for controlling application of current to a solenoid providing force as a linear function of applied current and for reducing power dissipation, said solenoid driver circuit including:
   a transistor means having a collector-emitter current path for completing one series current path through the solenoid;
   a diode coupled in series with said collector-emitter current path of said transistor means for providing a parallel current path for the solenoid;
   a sense resistor coupled in series with said collector-emitter path of said transistor means for sensing current in the solenoid;
   a Zener diode coupled between said transistor means collector and base to provide voltage protection for said transistor means;
   a comparator means coupled to said sense resistor to compare a function of the voltage sensed across said sense resistor to an analog voltage;
   logic means coupled to said comparator means and said transistor means so as to receive input signals which are a function of the solenoid current and the analog voltage for switching said transistor means on and off as a function of the output of said comparator means so there is a period wherein solenoid driving current rises to a peak current and decays for a predetermined amount of time, the sustaining peak current being a function of the analog voltage; and
   an oscillatory signal source coupled to said comparator means for varying said analog voltage input to minimize hysteresis of the solenoid due to striction of the coil mechanism and magnetic hysteresis by keeping the solenoid in motion.

2. A solenoid driver circuit as recited in claim 1 wherein said oscillatory signal source generates a frequency sufficiently low so that the solenoid coil can respond to it and sufficiently high so that undesirable variations are not obtained in a solenoid coil controlled parameter.

3. A solenoid driver as recited in claim 2 wherein said oscillatory signal source has a signal frequency of about 100 Hz.

4. A solenoid driver as recited in claim 3 wherein said oscillatory signal source generates a square waveform.

5. A solenoid driver as recited in claim 3 wherein said oscillatory signal source generates a triangular waveform.

* * * * *